(12) United States Patent
Sekido

(10) Patent No.: US 9,408,309 B2
(45) Date of Patent: Aug. 2, 2016

(54) ELECTRONIC COMPONENT MOUNTING STRUCTURE

(71) Applicant: OLYMPUS CORPORATION, Tokyo (JP)

(72) Inventor: Takanori Sekido, Machida (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/305,453

(22) Filed: Jun. 16, 2014

(65) Prior Publication Data

US 2014/0367156 A1    Dec. 18, 2014

(30) Foreign Application Priority Data

Jun. 17, 2013   (JP) ................................. 2013-126921

(51) Int. Cl.
```
H05K 7/00      (2006.01)
H05K 1/18      (2006.01)
H05K 1/02      (2006.01)
H05K 1/14      (2006.01)
```
(52) U.S. Cl.
CPC .............. *H05K 1/183* (2013.01); *H05K 1/0284* (2013.01); *H05K 1/14* (2013.01); *H01L 2224/16227* (2013.01); *H01L 2924/15156* (2013.01); *H01L 2924/15157* (2013.01); *H05K 1/181* (2013.01); *H05K 2201/047* (2013.01)

(58) Field of Classification Search
USPC .................................... 361/760, 761; 174/260
See application file for complete search history.

(56) References Cited

U.S. PATENT DOCUMENTS 6,256,203 B1 *   7/2001   Ingraham et al. ............. 361/720
2010/0052189 A1 *   3/2010   Sakurai et al. ................. 257/778

FOREIGN PATENT DOCUMENTS

JP            4046088 B2      2/2008

OTHER PUBLICATIONS

English Abstract of JP 2005-217347, dated Aug. 11, 2005.

* cited by examiner

*Primary Examiner* — Andargie M Aychillhum
(74) *Attorney, Agent, or Firm* — Scully, Scott, Murphy & Presser, PC

(57) ABSTRACT

An electronic component mounting structure includes a three-dimensional substrate having a three-dimensional shape and including a hollow portion formed on at least one of side surfaces of the three-dimensional substrate, and an electronic component mounted on a bottom face of the hollow portion. The three-dimensional substrate includes an opening portion on a side surface different from a side surface on which the hollow portion is formed for allowing observation of a connection portion between the bottom face of the hollow portion and the electronic component from an outer periphery side of the three-dimensional substrate.

16 Claims, 8 Drawing Sheets

ELECTRONIC COMPONENT MOUNTING STRUCTURE

CROSS-REFERENCE TO RELATED APPLICATIONS

This application is based upon and claims the benefit of priority from Japanese Patent Application No. 2013-126921, filed on Jun. 17, 2013, the entire contents of which are incorporated herein by reference.

BACKGROUND

1. Technical Field

The disclosure relates to an electronic component mounting structure.

2. Related Art

In recent years, there has been a great desire for increasing mounting density of the electronic component mounting structure in which an electronic component such as a semiconductor chip is mounted.

As a technique for increasing mounting density of the component, there has been disclosed a three-dimensional electronic circuit substrate in which an electronic component is mounted in a hollow portion provided on a side surface, and a plurality of circuit substrates is connected through a relay substrate on which lead-out wiring is formed on upper and lower surfaces thereof (see JP 4046088 B1, for example).

SUMMARY

In some embodiments, an electronic component mounting structure includes a three-dimensional substrate having a three-dimensional shape and including a hollow portion formed on at least one of side surfaces of the three-dimensional substrate, and an electronic component mounted on a bottom face of the hollow portion. The three-dimensional substrate includes an opening portion on a side surface different from a side surface on which the hollow portion is formed for allowing observation of a connection portion between the bottom face of the hollow portion and the electronic component from an outer periphery side of the three-dimensional substrate.

The above and other features, advantages and technical and industrial significance of this invention will be better understood by reading the following detailed description of presently preferred embodiments of the invention, when considered in connection with the accompanying drawings.

DETAILED DESCRIPTION

Figure 1A:
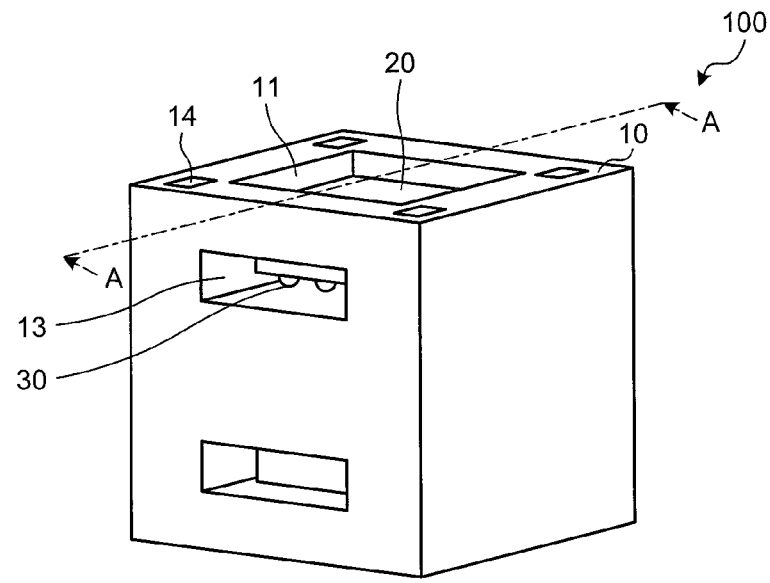
FIG. 1A is a perspective view of an electronic component mounting structure according to a first embodiment of the present invention.

Hereinafter, with reference to the attached drawings, modes for carrying out the invention (hereinafter, referred to as "embodiments") will be described. Note that the embodiments are not intended to limit the present invention. Furthermore, in illustration of the drawings, the same part is denoted with the same reference numeral. Furthermore, the drawings are schematic, whereby it is to be noted that a relationship between thickness and width of each member, a ratio in each member, and the like may be different from reality. Between the drawings, there may be a part in which a relationship and a ratio between dimensions are different.

First Embodiment

Figure 1B:
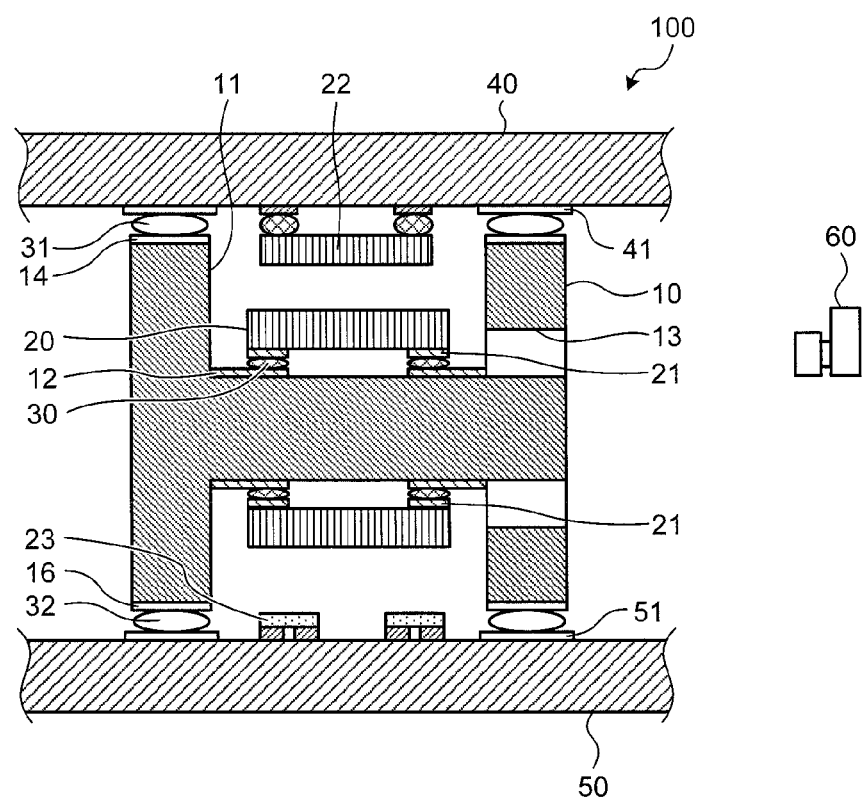
FIG. 1B is a sectional view of an electronic circuit apparatus using the electronic component mounting structure in FIG. 1A as a relay substrate (sectional view taken along line A-A of FIG. 1A)
Figure 1C:
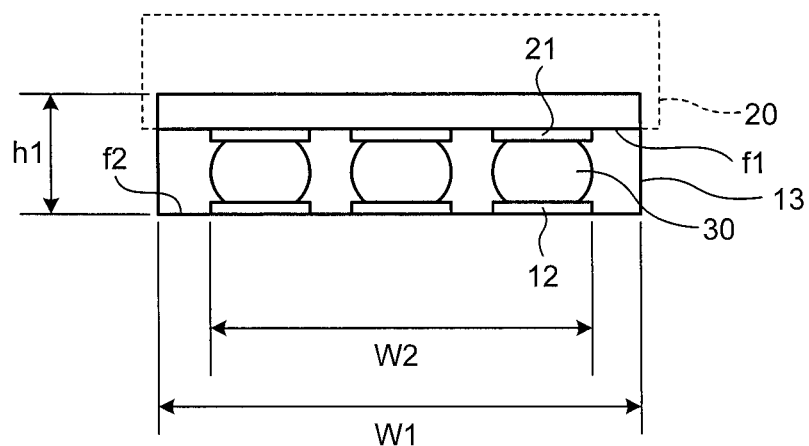
FIG. 1C is an enlarged view around an opening portion of the electronic component mounting structure in FIG. 1A viewed from outside of a three-dimensional substrate.

FIG. 1A is a perspective view of an electronic component mounting structure 100 according to a first embodiment of the invention. FIG. 1B is a sectional view of an electronic circuit apparatus using the electronic component mounting structure 100 as a relay substrate, and a section taken along line A-A of FIG. 1A is illustrated. FIG. 1C is an enlarged view around an opening portion 13 of the electronic component mounting structure 100 viewed from outside of a three-dimensional substrate. The electronic component mounting structure 100 according to the first embodiment of the present invention is a structure having a three-dimensional substrate 10 on which an electronic component 20 is mounted.

The three-dimensional substrate 10 includes: a hollow portion 11 in which the electronic component 20 is mounted; a connection electrode 12 connected to a connection terminal 21 of the electronic component 20; the opening portion 13 having a height at which each of a plane including a bottom face f2 of the hollow portion 11 and a plane including a surface f1 on which the connection terminal 21 of the electronic component 20 is formed passes through, and having a width, which is not more than a width of the electronic component 20 and not less than a width of the connection terminal 21; a connection land 14 to be connected to a connection electrode 41 of a circuit substrate 40; wiring 15 for connecting the connection electrode 12 to the connection land 14; and a connection land 16 to be connected to a connection electrode 51 of a circuit substrate 50.

The hollow portion 11 is provided in at least one of side surfaces forming an external form of the three-dimensional substrate 10. In the first embodiment, the hollow portion 11 is formed on each of upper and lower surfaces of the three-dimensional substrate 10. A base area of the hollow portion 11 may be in a size such that the electronic component 20 can be mounted, and a height of the hollow portion 11 may be in a relationship of: height of the electronic component 20<height of the hollow portion 11+height of the connection land 14+height of a connection member 31+height of the connection electrode 41. Since the electronic component mounting structure 100 in the first embodiment is connected to the circuit substrate 40 and the circuit substrate 50 at the top and the bottom thereof, in a case where an electronic component 22, an electronic component 23, and the like are mounted on a surface opposing each of the hollow portions 11 of the circuit substrate 40 and the circuit substrate 50, the height of the hollow portion 11 may be in a relationship of: height of the electronic component 20+height of the electronic component 22<height of the hollow portion 11+height of the connection land 14+height of the connection member 31+height of the connection electrode 41.

The opening portion 13 is formed in a side surface different from the side surface in which the hollow portion 11 is formed at a position where it is possible to observe a connection portion for connecting the connection terminal 21 and the connection electrode 12, from the outside of the three-dimensional substrate 10. In the first embodiment, the electronic component 20 is mounted on each of the hollow portions 11 provided on the upper and lower surfaces, whereby two opening portions 13 are formed. In the electronic component mounting structure 100 according to the first embodiment, one opening portion 13 is formed for one electronic component 20, and an imaging apparatus 60 for observation is arranged on an extended line of the opening portion 13 and the connection portion for connecting the connection terminal 21 and the connection electrode 12. The imaging apparatus 60 has a ring-shaped lighting around a lens thereof, and radiates light from the ring-shaped lighting toward the connection portion through the opening portion 13, and observes the light reflected by the connection portion. By arranging the opening portion 13 to a position where it is possible to observe the connection portion, in which the connection terminal 21 is connected to the connection electrode 12, from the outside of the three-dimensional substrate 10, a visual test of a connection failure and the like becomes possible. Note that the lighting may also be provided separately from the imaging apparatus 60 (e.g. an external light source to which a light guide is attached).

In the first embodiment, the opening portion 13 enables observation of the connection portion (three in FIG. 1C) in which all of the connection terminals 21 formed on one of the side surfaces of the electronic component 20 are connected to the connection electrodes 12 formed on the bottom face of the hollow portion 11. In order to enable the observation of the connection portion in which all of the connection terminals 21 formed on one of the side surfaces of the electronic component 20 are connected to the connection electrodes 12, a height h1 of the opening portion 13 is the height at which each of the plane including the bottom face f2 of the hollow portion 11 and the plane including the surface f1 on which the connection terminal 21 of the electronic component 20 is formed passes through, or a height at which it is possible to observe the connection electrode 12, a connection member 30, and the connection terminal 21, and a width W1 is equal to or more than a length W2 at which it is possible to observe all of the connection terminals 21 formed on one of the side surfaces of the electronic component 20.

On the upper and lower surfaces of the three-dimensional substrate 10, or the surface on which the hollow portion 11 is formed, the connection land 14 to be connected to the circuit substrate 40 and the connection land 16 to be connected to the circuit substrate 50 are formed. The three-dimensional substrate 10 is connected to the circuit substrate 40 and the circuit substrate 50 by the connection member 31 and a connection member 32 through the connection lands 14 and 16, respectively.

Figure 1D:
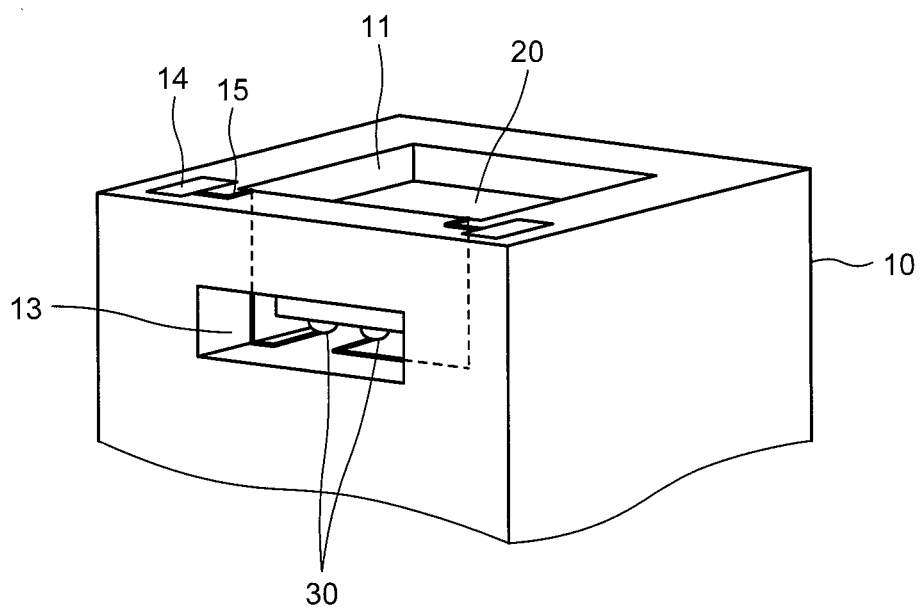
FIG. 1D is an enlarged view of an upper part of the electronic component mounting structure in FIG. 1A.
Figure 1E:
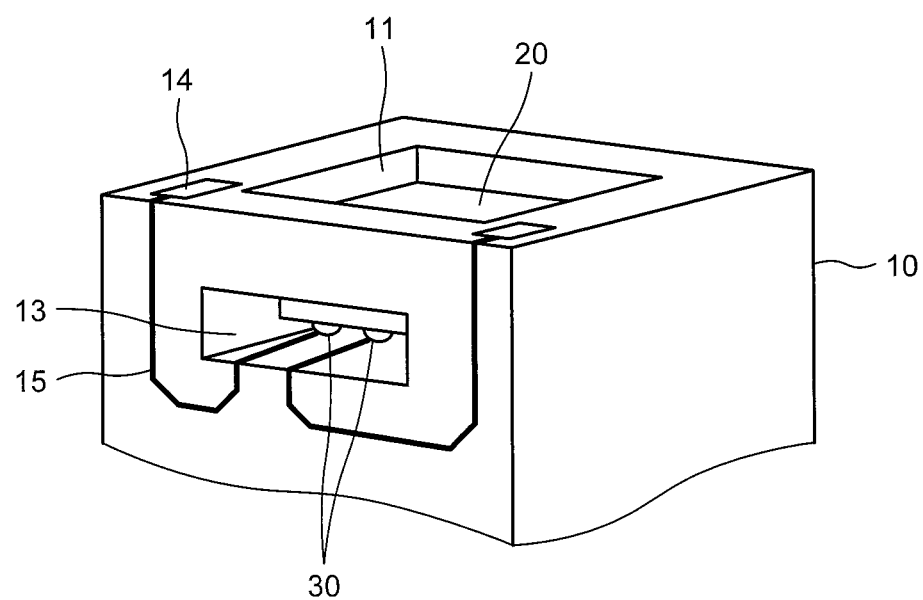
FIG. 1E is an enlarged view of an upper part of the electronic component mounting structure according to another example.

It is preferred that the wiring 15, which connects the connection electrode 12 to the connection land 14 be formed inside the hollow portion 11 as illustrated in FIG. 1D. It is because, in a case where the wiring 15 is formed on surfaces of the opening portion 13 and the three-dimensional substrate 10 as illustrated in FIG. 1E, during observation using the imaging apparatus 60, there is a fear that the observation of the connection portion may be hindered by radiated light being reflected or the like by the wiring 15.

In the electronic component mounting structure 100 according to the first embodiment, it is possible to improve a mounting density by mounting the electronic component 20 on the bottom face of the hollow portion 11. In addition, since the connection portion of the connection terminal 21 of the electronic component 20 and the connection electrode 12 can be observed from the opening portion 13, it is possible to detect a mounting failure of an electronic component.

Second Embodiment

Figure 2A:
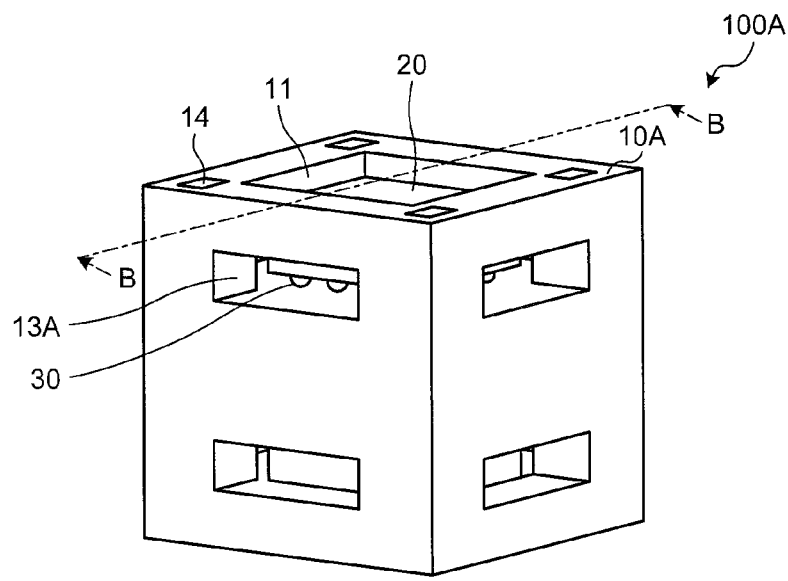
FIG. 2A is a perspective view of an electronic component mounting structure according to a second embodiment of the present invention.
Figure 2B:
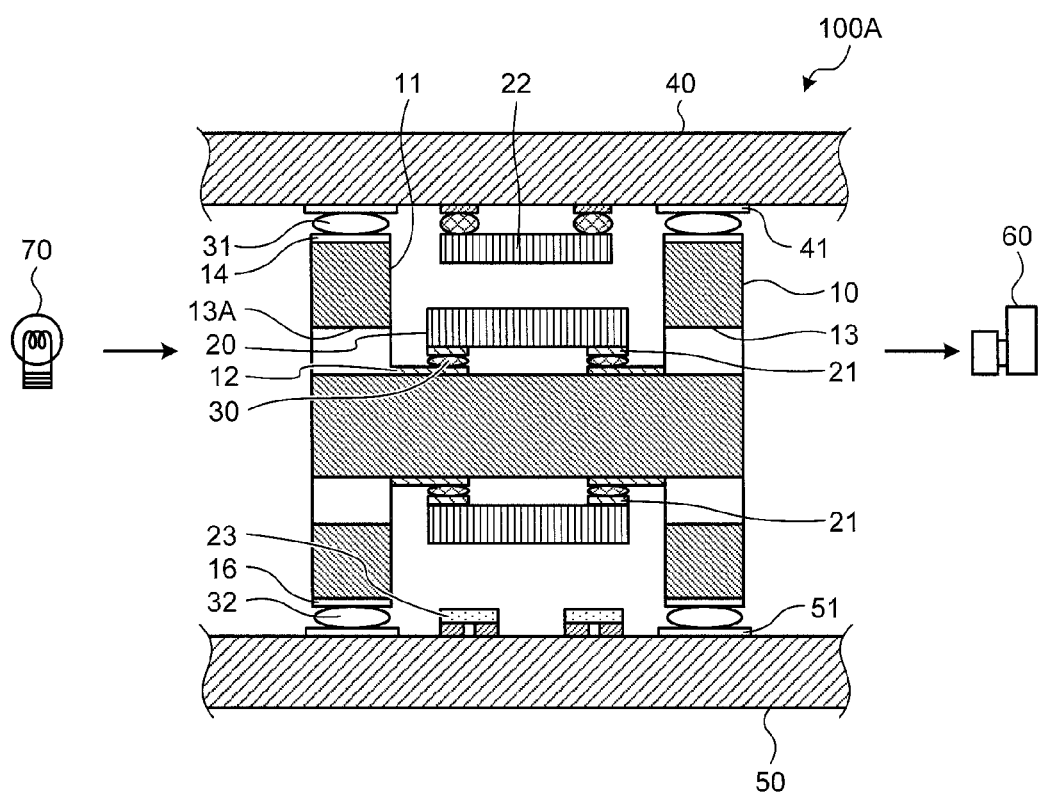
FIG. 2B is a sectional view of an electronic circuit apparatus using the electronic component mounting structure in FIG. 2A as a relay substrate (sectional view taken along line B-B of FIG. 2A)

An electronic component mounting structure 100A according to a second embodiment is different from that in the first embodiment in that it has four opening portions 13A for one electronic component 20. FIG. 2A is a perspective view of the electronic component mounting structure 100A according to the second embodiment of the present invention. FIG. 2B is a sectional view of an electronic circuit apparatus using the electronic component mounting structure 100A as a relay substrate, and a section taken along line B-B of FIG. 2A is illustrated.

In the second embodiment, the opening portion 13A is provided on each of four side surfaces of a three-dimensional substrate 10A having a rectangular pillar shape. Similar to the opening portion 13 of the first embodiment, the opening portion 13A is shaped so as to have a height at which each of a plane including a bottom face of a hollow portion 11 and a plane including a surface on which a connection terminal 21 of the electronic component 20 is formed passes through, or a height at which it is possible to observe a connection electrode 12, a connection member 30, and a connection terminal 21, and a width thereof is equal to or more than a length at which it is possible to observe all of the connection terminals 21 formed on one of the side surfaces of the electronic component 20. In the second embodiment, similar to the first embodiment, the electronic component 20 is mounted on each of the hollow portions 11 provided on upper and lower surfaces, whereby two opening portions 13A are formed on each surface, or eight opening portions 13A in total are formed.

In the electronic component mounting structure 100A according to the second embodiment, lighting 70 for irradiating a connection portion between the connection terminal 21 of the electronic component 20 and the connection electrode 12 with light, and an imaging apparatus 60 for observing are arranged on an extended line of the opening portions 13A formed in opposing positions on opposing side surfaces of the three-dimensional substrate 10A. The light emitted from the lighting 70 is radiated to inside the hollow portion 11 through one of the opening portions 13A, and the imaging apparatus 60 observes transmitted light, which is radiated from the lighting 70 to the connection portion of the electronic component 20 on a side of the imaging apparatus 60. To observe the connection portion of the connection terminal 21 on another side surface of the electronic component 20, arrangements of the lighting 70 and the imaging apparatus 60 may be changed. In the second embodiment, the opening portion 13A is formed on each of the four side surfaces of the three-dimensional substrate 10A, whereby it is possible to observe the connection portion of all of the connection terminals 21 formed on the side surfaces of the electronic component 20. Furthermore, since the opening portion 13A is formed in an opposing position of the three-dimensional substrate 10A, it is possible to observe a silhouette of the connection portion by the transmitted light, whereby it becomes easier to detect open caused by insufficiency of the connection member 30, a short circuit with the adjacent connection terminal 21 caused when the connection member 30 is in a large amount, and the like.

Here, manufacturing of the electronic circuit apparatus using the electronic component mounting structure 100A in the second embodiment will be described with reference to FIGS. 3A to 3D. FIGS. 3A to 3D are views illustrating a method of manufacturing the electronic circuit apparatus illustrated in FIG. 2B.

Figure 3A:
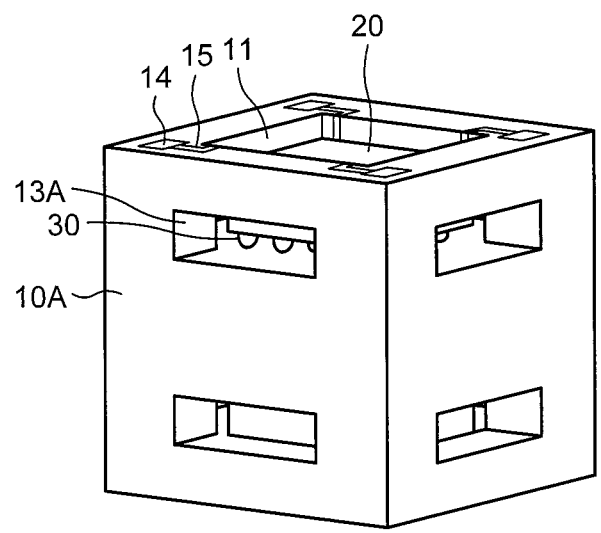
FIG. 3A is a view illustrating a method of manufacturing the electronic circuit apparatus in FIG. 2B.

First, as illustrated in FIG. 3A, the electronic component mounting structure 100A is manufactured by installing the electronic component 20 in the hollow portion 11 of the three-dimensional substrate 10A and by connecting the connection terminal 21 of the electronic component 20 with the connection electrode 12 by the connection member 30.

Figure 3B:
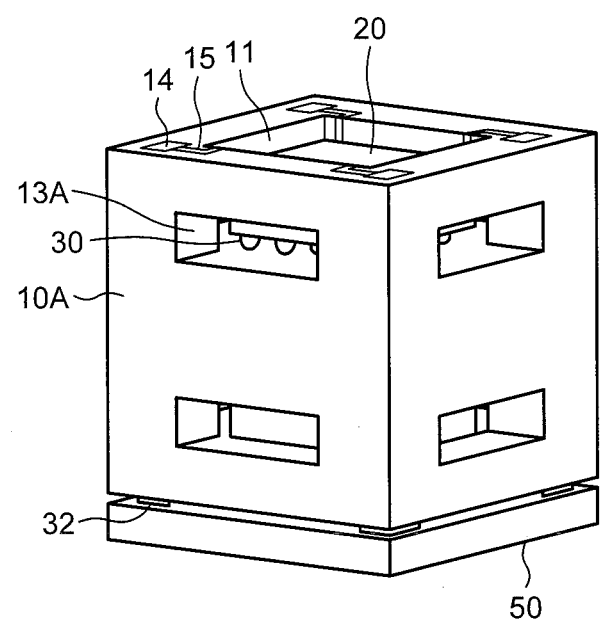
FIG. 3B is a view illustrating the method of manufacturing the electronic circuit apparatus in FIG. 2B.

Then, as illustrated in FIGS. 2B and 3B, a connection land 16 of the three-dimensional substrate 10A is connected to a connection electrode 51 of a circuit substrate 50 by a connection member 32, and the three-dimensional substrate 10A is mounted on the circuit substrate 50.

Figure 3C:
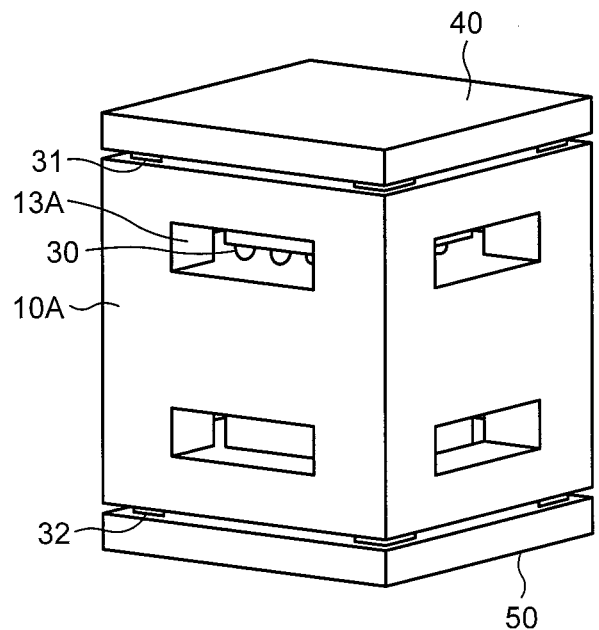
FIG. 3C is a view illustrating the method of manufacturing the electronic circuit apparatus in FIG. 2B.

Similarly, as illustrated in FIGS. 2B and 3C, a connection land 14 of the three-dimensional substrate 10A is connected to a connection electrode 41 of a circuit substrate 40 by a connection member 31, and the circuit substrate 40 is mounted on the three-dimensional substrate 10A.

Figure 3D:
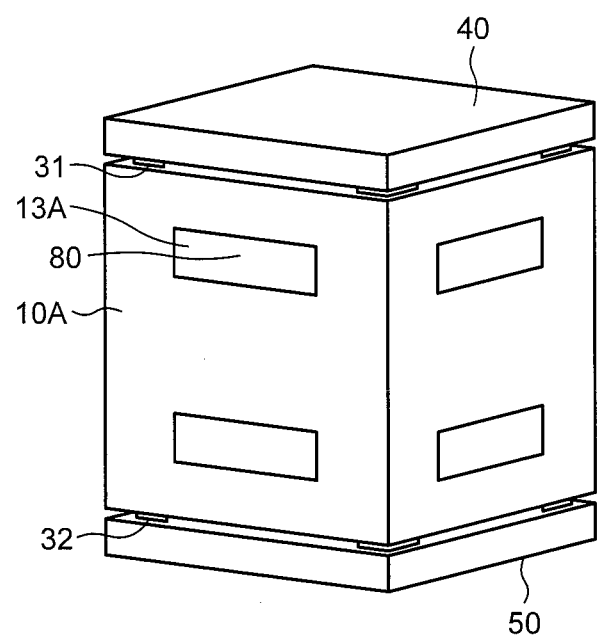
FIG. 3D is a view illustrating the method of manufacturing the electronic circuit apparatus in FIG. 2B.

After the three-dimensional substrate 10A is connected to the circuit substrate 40 and the circuit substrate 50, as illustrated in FIG. 3D, the hollow portion 11 and the opening portion 13A are filled with a reinforcement member 80 made of resin, and an electronic circuit apparatus is manufactured. The hollow portion 11 may be filled with the reinforcement member 80 therein through the opening portion 13A. By filling the hollow portion 11 and the opening portion 13A with the reinforcement member 80, it is possible to protect the connection portion of the connection terminal 21 and the connection electrode 12 as well as to improve rigidity of the electronic component mounting structure 100A, whereby it is possible to improve reliability of the product.

As described above, filling of the hollow portion 11 and the opening portion 13A with the reinforcement member 80 may be performed after connecting with the circuit substrates 40 and 50 or after mounting the electronic component 20 on the three-dimensional substrate 10A (immediately after FIG. 3A). However, in a case where the reinforcement member 80 having a heat expansion coefficient largely diverged from a heat expansion coefficient of the three-dimensional substrate 10A is used, stress is generated due to fluctuation in temperature when connected to the circuit substrates 40 and 50 afterwards. Accordingly, the three-dimensional substrate 10A is deformed, and a connection failure such as the open and the short circuit may be caused in the connection portion of the circuit substrates 40 and 50 and the three-dimensional substrate 10A, or reliability of the connection portion may decrease. Therefore, it is preferred that the reinforcement member 80 be filled after the three-dimensional substrate 10A is connected to the circuit substrates 40 and 50. Since the electronic component mounting structure 100A according to the second embodiment is provided with the opening portion 13A, filling of the reinforcement member 80 may be possible after being connected to the circuit substrates 40 and 50.

Furthermore, the reinforcement member 80 may fill the entire hollow portion 11 as illustrated in FIG. 3D, or around the connection portion of the connection terminal 21 of the electronic component 20 and the connection electrode 12, for example, only a gap between a bottom face of the hollow portion 11 and the electronic component 20, to a part of the connection terminal 21, the connection electrode 12, and the connection member 30 that are visible through the opening portion 13A such that the reinforcement member 80 does not adhere thereto, while arranging another transparent member to the opening portion 13A. Accordingly, by filling around the connection portion with the reinforcement member 80, it is possible to improve connection strength, and by arranging the transparent member to the opening portion 13A, it is possible to improve rigidity of the three-dimensional substrate 10A as well as to detect a connection failure by observing the connection portion through the opening portion 13A in which the transparent member is arranged. Furthermore, it is also possible to select a transparent material as the reinforcement member 80, protect the connection portion by filling the reinforcement member 80 around the connection portion, and obtain the transparent member by filling it inside the opening portion 13A.

Figure 4:
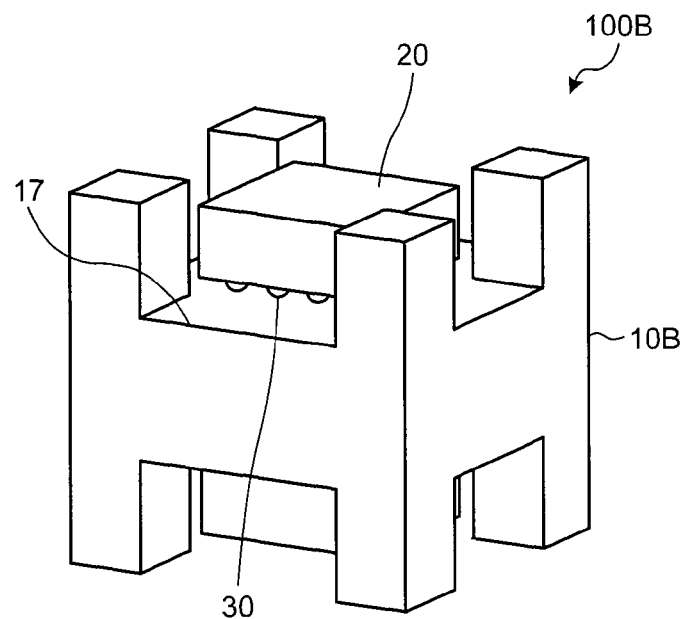
FIG. 4 is a perspective view of an electronic component mounting structure according to a first modification of the second embodiment of the present invention.

Note that a cut-out portion 17 may be provided in place of the opening portion 13A as long as it is possible to observe the connection portion of the connection terminal 21. By replacing the opening portion 13A with the cut-out portion 17, processing of the three-dimensional substrate becomes easier, whereby a cost of the three-dimensional substrate can be suppressed. FIG. 4 is a perspective view of an electronic component mounting structure 100B according to a first modification of the second embodiment of the present invention.

In the electronic component mounting structure 100B according to the first modification, a three-dimensional substrate 10B has a cut-out portion 17 on each of side surfaces thereof from an upper surface or a lower surface thereof to a bottom face of the hollow portion 11. A width of the cut-out portion 17 may not be less than a length at which the connection portion of the connection terminal 21 to be observed can be observed, and the width of the cut-out portion 17 according to the first modification is a length at which all of the connection terminals 21 formed on one of the side surfaces of the electronic component 20 can be observed.

In the first modification of the second embodiment, the cut-out portion 17 is formed on four of the side surfaces of the three-dimensional substrate 10B such that all of the connection portions of the connection terminals 21 formed on the side surfaces of the electronic component 20 can be observed. Furthermore, similar to the opening portion 13A, since the cut-out portion 17 is formed in an opposing position of the three-dimensional substrate 10B, it is possible to observe a silhouette of the connection portion by the transmitted light.

Figure 5:
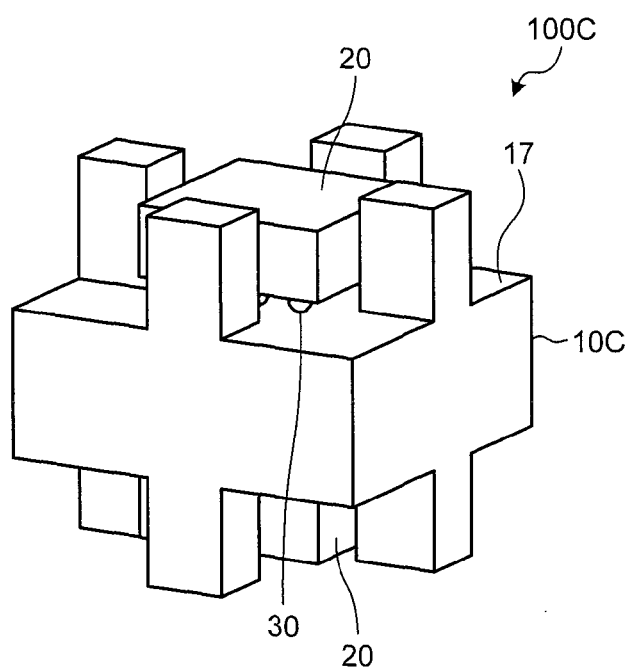
FIG. 5 is a perspective view of an electronic component mounting structure according to a second modification of the second embodiment of the present invention.

Furthermore, the cut-out portion 17 may be provided to a corner portion of the three-dimensional substrate. FIG. 5 is a perspective view of an electronic component mounting structure 100C according to a second modification of the second embodiment of the present invention.

Although it is more effective to observe all of the connection portions of the connection terminal 21 formed around the electronic component 20 in order to detect a mounting failure, a connection state of the connection terminal 21, which is formed at four corners of the electronic component 20, has the most influence on the connection strength. Therefore, it is also possible to observe the connection portion of the connection terminal 21, which is formed at the four corners of the electronic component 20, by providing the cut-out portion 17 to the corner portion of a three-dimensional substrate 10C. By providing the cut-out portion 17 to the corner portion of the three-dimensional substrate, it is possible to increase an amount of the reinforcement member 80 arranged around the four corners of the electronic component 20 where structurally the most load is applied, whereby reliability of the electronic component mounting structure can be improved.

Third Embodiment

Figure 6:
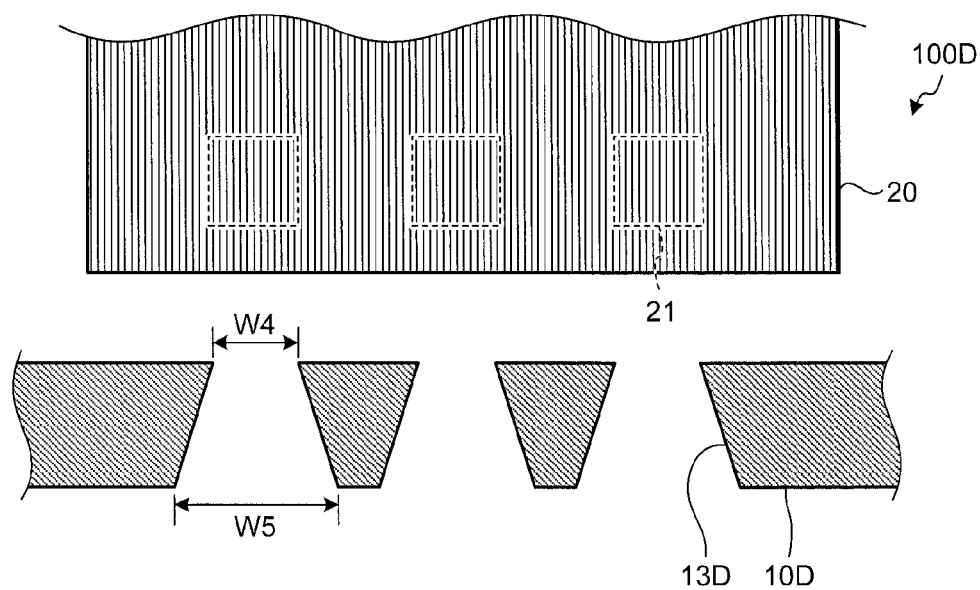
FIG. 6 is a sectional view of a horizontal plane at a position of an opening portion of an electronic component mounting structure according to a third embodiment of the present invention.
Figure 7:
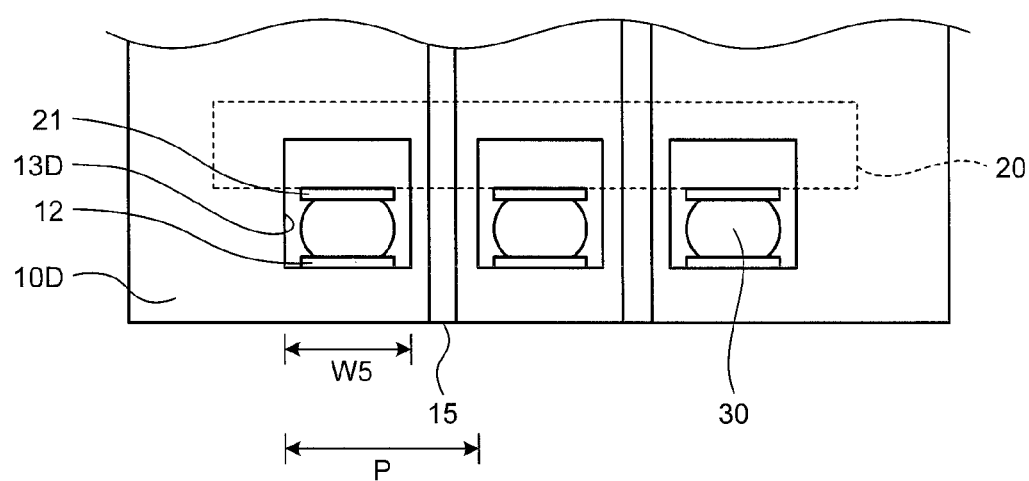
FIG. 7 is an enlarged view around the opening portion in FIG. 6 viewed from outside of a three-dimensional substrate.

An electronic component mounting structure 100D according to a third embodiment is different from that according to the first and second embodiments in that an opening portion 13D is formed for each of connection terminals 21 formed around an electronic component 20. FIG. 6 is a sectional view of a horizontal plane in a position of the opening portion 13D of an electronic component mounting structure 100D according to the third embodiment of the present invention. FIG. 7 is an enlarged view around the opening portion of the electronic component mounting structure 100D in FIG. 6 viewed from outside of a three-dimensional substrate 10D.

The opening portion 13D formed for each of the connection terminals 21 is arranged at a position where a connection portion of the connection terminal 21 and a connection electrode 12 can be observed from the outside of the three-dimensional substrate 10D. A height of the opening portion 13D, similar to the opening portions 13 and 13A of the first and second embodiments, is to be a height at which each of a plane including a bottom face of a hollow portion 11 and a plane including a surface on which the connection terminal 21 of the electronic component 20 is formed passes through, or a height at which it is possible to observe the connection electrode 12, a connection member 30, and the connection terminal 21.

The three-dimensional substrate 10D according to the third embodiment has a fine structure (hollow portion 11, opening portion 13D, and the like), whereby it is preferred that it be manufactured by injection molding of resin. Molding becomes easy when the opening portion 13D has a mortar shape. In a case where light is radiated from outside of the three-dimensional substrate 10D, and the light reflected by the connection portion is observed, as illustrated in FIG. 6, it is preferred that the opening portion 13D have a mortar shape in which an opening area increases from a side of the hollow portion 11 toward an outer surface of the three-dimensional substrate 10D. A width W4 on the side of the hollow portion 11 of the opening portion 13D is not less than a width of the connection terminal 21 of the electronic component 20, and a width W5 on an outer surface side is smaller than a pitch P between the adjacent connection terminals 21. With the width W4 not less than a width of the connection terminal 21, observation of the connection portion becomes possible, and with the width W5 smaller than the pitch P between the adjacent connection terminals 21, wiring 15 can be formed on a wall between the opening portions 13D, thereby improving a degree of freedom in design. In FIG. 7, the wiring 15 is formed outside of the three-dimensional substrate 10D; however, it is also possible to form the wiring 15 inside the hollow portion 11.

In the electronic component mounting structure 100D according to the third embodiment, similar to the first and second embodiments, it is possible to improve mounting density by mounting the electronic component 20 inside the hollow portion 11, and to observe the connection portion of the connection terminal 21 of the electronic component 20 and the connection electrode 12 through the opening portion 13D, whereby it is possible to detect mounting failure of the electronic component. Furthermore, since the opening portion 13D is provided per connection terminal 21, it is possible to form a wiring 15 on a wall of the opening portion 13D, whereby the degree of freedom in designing can be improved.

(Note 1)

A method of manufacturing an electronic component mounting structure in which an electronic component is mounted on a three-dimensional substrate, the method including:

a connecting step of mounting the electronic component in a hollow portion provided on at least one of side surfaces forming an external form of the three-dimensional substrate to connect a connection electrode to a connection terminal of the electronic component;

a testing step of observing a connection portion between a bottom face of the hollow portion and the electronic component from an outer periphery side of the three-dimensional substrate, through an opening portion formed on a side surface different from a side surface on which the hollow portion of the three-dimensional substrate is formed; and a filling step of filling the connection portion between the connection terminal and the connection electrode with a reinforcement member through the opening portion.

(Note 2)

A method of manufacturing an electronic circuit apparatus in which an electronic component mounting structure and at least one or more circuit substrates are connected to each other, the method including:

a mounting step of mounting an electronic component in a hollow portion provided on at least one of side surfaces forming an external form of a three-dimensional substrate, and connecting a connection electrode to a connection terminal of the electronic component to manufacture the electronic component mounting structure;

a testing step of observing a connection portion between a bottom face of the hollow portion and the electronic component from an outer periphery side of the three-dimensional substrate, through an opening portion formed on a side surface different from a side surface on which the hollow portion of the three-dimensional substrate is formed;

a connecting step of connecting the electronic component mounting structure to the at least one or more circuit substrates; and a filling step of filling the connection portion between the connection terminal and the connection electrode with a reinforcement member through the opening portion.

As described above, the electronic component mounting structure according to some embodiments is useful in a field in which improvement of mounting density of the electronic component is demanded.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic component mounting structure, comprising: a three-dimensional substrate having a three dimensional shape and including a hollow portion formed on at least one of side surfaces of the three dimensional substrate the three-dimensional substrate including: a bottom face, and four wall portions forming the hollow portion, each perpendicularly connected to the bottom face: and an electronic component mounted on the bottom face of the hollow portion, wherein in at least one of the four wall portions, the three dimensional substrate includes an opening portion is formed on a side surface different from a side surface on which the hollow portion is formed for allowing observation of a connection portion between the bottom face of the hollow portion and the electronic component from an outer periphery side of the three-dimensional substrate, wherein the three-dimensional substrate includes a connection electrode on the bottom face of the hollow portion, the electronic component includes a connection terminal connected to the connection electrode, and the opening portion has a height at which each of a plane including the bottom face of the hollow portion and a plane including a surface of the electronic component opposed to the three-dimensional substrate passes through, and has a width not more than a width of the electronic component and not less than a width of the connection terminal.

2. The electronic component mounting structure according to claim 1, wherein
the three-dimensional substrate further includes additional one or more opening portions, wherein
each of the opening portion and the additional one or more opening portions is formed at a position opposed to any of the other opening portions.

3. The electronic component mounting structure according to claim 1, wherein the opening portion has a mortar shape in which an opening area increases from a side of the hollow portion toward an outer surface of the three-dimensional substrate.

4. The electronic component mounting structure according to claim 1, wherein
the three-dimensional substrate further includes:
a connection land provided on a side surface on which the hollow portion is formed, the connection land being connected to a circuit substrate; and
wiring for connecting the connection electrode to the connection land, wherein
the wiring is disposed inside the hollow portion.

5. The electronic component mounting structure according to claim 1, wherein
the three-dimensional substrate further includes additional one or more opening portions, and the electronic component further includes additional one or more connection terminals,
the opening portion and the additional one or more opening portions are provided for each of the connection terminal and the additional one or more connection terminals to be observed, and
a width of each of the opening portion and the additional one or more opening portions is smaller than a pitch between adjacent connection terminals.

6. The electronic component mounting structure according to claim 1, further comprising a transparent member arranged in the opening portion.

7. The electronic component mounting structure according to claim 1, further comprising an electrode on one or more end faces of the four wall portions for connecting the electrode to a circuit substrate.

8. The electronic component mounting structure according to claim 1, wherein;
the four wall portions are perpendicularly connected to a first side of the bottom face;
the connection portion is a first connection portion and the electronic component is a first electronic component mounted on the first side of the bottom face; and
the three-dimensional substrate further comprising four additional walls perpendicularly connected to a second side of the bottom face;
wherein an additional opening portion is formed in at least one of the four additional wall portions for allowing observation of a second connection portion between the second side of the bottom face and a second electronic component mounted on the second side of the bottom face from an outer periphery side of the three-dimensional substrate.

9. A substrate comprising: a three-dimensional substrate body having a hollow portion, the three-dimensional substrate body including: a bottom face; and four wall portions forming the hollow portion, each perpendicularly connected to the bottom face; wherein an opening portion is formed in at least one of the four wall portions for allowing observation of a connection portion between the bottom face of the hollow portion and an electronic component mounted on the bottom face from an outer periphery side of the three-dimensional substrate body, wherein the three-dimensional substrate body includes a connection electrode on the bottom face of the hollow portion, and the opening portion has a height at which each of a plane including the bottom face of the hollow portion and a plane including a surface of the electronic component opposed to the three-dimensional substrate body passes through, and has a width not more than a width of the electronic component and not less than a width of a connection terminal of the electronic component connected to the connection electrode.

10. The substrate according to claim 9, wherein
the three-dimensional substrate body further includes additional one or more opening portions, wherein
each of the opening portion and the additional one or more opening portions is formed at a position opposed to any of the other opening portions.

11. The substrate according to claim 9, wherein the opening portion has a mortar shape in which an opening area increases from a side of the hollow portion toward an outer surface of the three-dimensional substrate body.

12. The substrate according to claim 9, wherein
the three-dimensional substrate body further includes:
a connection land provided on a side surface on which the hollow portion is formed, the connection land being connected to a circuit substrate; and
wiring for connecting the connection electrode to the connection land, wherein
the wiring is disposed inside the hollow portion.

13. The substrate according to claim 9, wherein
the three-dimensional substrate body further includes additional one or more opening portions corresponding to additional one or more connection terminals of the electronic component,
the opening portion and the additional one or more opening portions are provided for each of the connection terminal and the additional one or more connection terminals to be observed, and a width of each of the opening portion and the additional one or more opening portions is smaller than a pitch between adjacent connection terminals.

14. The substrate according to claim 9, further comprising a transparent member arranged in the opening portion.

15. The substrate according to claim 9, further comprising an electrode on one or more end faces of the four wall portions for connecting the electrode to a circuit substrate.

16. The substrate according to claim 9, wherein;
the four wall portions are perpendicularly connected to a first side of the bottom face;
the connection portion is a first connection portion and the electronic component is a first electronic component mounted on the first side of the bottom face; and
the three-dimensional substrate body further comprising four additional walls perpendicularly connected to a second side of the bottom face;
wherein an additional opening portion is formed in at least one of the four additional wall portions for allowing observation of a second connection portion between the second side of the bottom face and a second electronic component mounted on the second side of the bottom face from an outer periphery side of the three-dimensional substrate body.

* * * * *